(12) United States Patent
Ufert et al.

(10) Patent No.: US 7,312,491 B2
(45) Date of Patent: Dec. 25, 2007

(54) CHARGE TRAPPING SEMICONDUCTOR MEMORY ELEMENT WITH IMPROVED TRAPPING DIELECTRIC

(75) Inventors: Klaus-Dieter Ufert, Unterschleißheim (DE); Josef Willer, Riemerling (DE)

(73) Assignee: Infineon Technologies, AG, Neubiberg (DE)

( * ) Notice: Subject to any disclaimer, the term of this patent is extended or adjusted under 35 U.S.C. 154(b) by 63 days.

(21) Appl. No.: 11/359,783

(22) Filed: Feb. 23, 2006

(65) Prior Publication Data

US 2006/0197141 A1    Sep. 7, 2006

(30) Foreign Application Priority Data

Feb. 23, 2005    (DE)    ...................... 10 2005 008 321

(51) Int. Cl.
*H01L 27/108*    (2006.01)

(52) U.S. Cl. .................. 257/296; 257/77; 257/314; 257/315; 257/316; 257/322; 257/324; 257/405; 257/406

(58) Field of Classification Search .................. None
See application file for complete search history.

(56) References Cited

U.S. PATENT DOCUMENTS

| 6,706,599 B1 | 3/2004 | Sadd et al. |
| 6,989,565 B1* | 1/2006 | Aronowitz et al. ......... 257/324 |
| 2003/0049900 A1 | 3/2003 | Forbes et al. |
| 2003/0205812 A1 | 11/2003 | Swanson et al. |
| 2004/0136240 A1 | 7/2004 | Zheng et al. |

* cited by examiner

*Primary Examiner*—Evan Pert
*Assistant Examiner*—Tan Tran
(74) *Attorney, Agent, or Firm*—Edell, Shapiro & Finnan, LLC

(57) ABSTRACT

A semiconductor memory element, which can be controlled via field effect, includes a semiconductor substrate of a first conduction type, a first doping region of a second conduction type provided in the semiconductor substrate, a second doping region of the second conduction type provided in the semiconductor substrate, a channel region located between the first and second doping regions, a multilayer gate dielectric which is arranged adjacent to the channel region and has a charge trapping memory layer, and a gate terminal provided above the gate dielectric. The charge trapping memory layer includes at least one sequence of adjacent layers, wherein the sequence of adjacent layers comprises an amorphous silicon carbide layer and an amorphous silicon nitride layer.

12 Claims, 5 Drawing Sheets

CHARGE TRAPPING SEMICONDUCTOR MEMORY ELEMENT WITH IMPROVED TRAPPING DIELECTRIC

CROSS REFERENCE TO RELATED APPLICATIONS

This application claims priority under 35 USC §119 to German Application No. DE 10 2005 008 321.8, filed on Feb. 23, 2005, and titled "Charge Trapping Semiconductor Memory Element with Improved Trapping Dielectric," the entire contents of which are hereby incorporated by reference.

FIELD OF THE INVENTION

The present invention takes effect within the technical field of electrically writable and erasable, nonvolatile semiconductor memories and relates in particular to a charge trapping semiconductor memory element which can be controlled by means of field effect and has a multilayer gate dielectric for trapping charge carriers.

BACKGROUND

A semiconductor memory cell, which is based on the principle of charge trapping, has a memory transistor, which is positioned on a top side of a semiconductor body (substrate) or of a semiconductor layer, which is provided with a gate electrode arranged between the source and drain regions formed in the semiconductor material. The gate electrode is insulated from the semiconductor material by a dielectric material. Particularly in the case of a charge trapping memory cell, between the gate electrode and the source region and between the gate electrode and the drain region there is a layer sequence which comprises a memory layer. The memory layer serves to trap charge carriers, i.e., electrons or holes, between the boundary layers. The material of the memory layer is selected in such a way that it has a lower energy band gap, i.e., the gap between valence band and conduction band, than that of the boundary layer material. Therefore, the charges will remain localized on the storage layer. The material selected for the boundary layers is usually an oxide, in particular silicon dioxide, whereas a nitride, in particular silicon nitride, is selected for the memory layer material. A structure of this type is also known as an "ONO" structure of "SONOS" transistors. Charge trapping memory cells of this type are well known and have been described in a wide range of publications, e.g., the German patent application DE 199 03 598.9, in the name of the same Applicant.

Field effect transistors of the SONOS type described above are preferably used in silicon semiconductor memory technology as nonvolatile memory elements, i.e., EEPROM. Field effect transistors are preferred to other types of transistors, e.g., transistors having a floating gate, because: they have a simpler cell structure, they are relatively inexpensive to fabricate, and they have a lower defect density. As has also emerged, in transistors having a transistor structure of this type, defects generally have less effect on the functioning of the memory element. Furthermore, memory cells with a structure of the SONOS type have the crucial advantage that adjacent memory cells interact with one another to a lesser extent, which is the consequence in particular of a lower capacitive coupling. However, specifically capacitive coupling of this type constitutes a serious problem in the context of ongoing miniaturization, and this problem is the subject of intensive research in the field of memory cells with a floating gate, in particular in the form of multilevel transistors, as what is known as floating gate/floating gate interference.

In view of the advantageous properties of charge trapping memory cells which have been listed above, considerable efforts are being devoted to further improving this memory technology: a focal point with a view to further reducing the size of the memory transistors, is to improve the data retention, i.e., retention time, and increase the trapping probability of charge carriers in the trapping dielectric. Currently, a number of different solution approaches are being pursued.

One solution approach aimed at improving the charge trapping memory cells of the SONOS type consists in replacing the top dielectric, i.e. the dielectric boundary layer of the dielectric memory layer that is remote from the substrate, with a material possessing a higher dielectric constant and replacing the material of the gate electrode with a material possessing a higher electron work function (cf. the above-referenced German patent application; C. H. Lee et al. IEDM 2003; C. H. Lee et al. US patent application US 2003/0123307 A1).

With regard specifically to the data retention of charge trapping memory cells, it is important that the injected charge carriers be trapped in deep impurities, i.e., impurities which in energy terms are at a deep location in the band gap between valence band and conduction band. In this regard where the charge carriers have to be trapped in deep impurities, the $Si_3N_4$/SiN layer, which is customarily used for the memory layer, presents a problem, with regard to the desire to constantly reduce the minimum feature size, since it has a relatively small number of deep impurities and a relatively low efficiency in terms of trapping charge carriers and therefore, it possess restricted data retention.

Previous attempts to increase the efficiency of charge trapping, inter alia, focused on modifying the band gap between valence band and conduction band by using a silicon-richer phase in the SiN; wherein the SiN is typically deposited, via a low pressure chemical vapor deposition (LPCVD) technique, in such a way as to increase the number of trapping centers which can be achieved for the injected charge carriers (cf. T.-S. Chen et al., Electr. Dev. Lett., IEEE Vol. 25, No. 4 (2004) page 205). However, this approach leaves open the question as to whether the Si-richer phases actually generate further deep impurities, since these phases can also lead to Si—Si bonds. Furthermore, this Si-richer phase can lead to an increase in the leakage current. In addition, the data retention achieved by this method is unsatisfactory.

In another approach, it is attempted to combat these problems using a SiC:O trapping layer (cf. T. C. Chang et al., Appl. Phys. Lett. Vol. 84, No. 12, (2004) page 2094). However, these attempts have tended to lead to a reduction in the size of the storage window, since the oxygen doping saturates the deep impurities. Moreover, a layer thickness of 20 nm appears much too large when considering that in years to come the minimum feature sizes of the memory elements are to be scaled into the range of 60 nm.

SONOS or SANOS semiconductor memory cells of this type consist of: a tunnel oxide layer with an approximate thickness of 2.5 nm, a second oxide layer with an approximate thickness of 6 nm and, an LPCVD-SiN layer, with an approximate thickness of 6-8 nm, which is deposited between the two oxide layers.

SUMMARY

In accordance with the present invention, a semiconductor memory element, that is controllable via field effect, comprises a trapping dielectric, which has improved data retention and charge carrier trapping efficiency as compared to conventional semiconductor memory elements with trapping dielectrics, and is suitable for allowing further miniaturization of charge trapping memory cells.

The semiconductor memory element of the present invention can be controlled by field effect and comprises a semiconductor substrate, preferably silicon, of a first conduction type with first and second doping regions of a second conduction type arranged in the semiconductor substrate. A channel region is provided between the first and second doping regions, and furthermore there is a multilayer gate dielectric arranged adjacent to the channel region. In addition, a gate terminal is provided adjacent to the gate dielectric, wherein the gate dielectric separates the gate terminal from the channel region. The gate dielectric comprises a plurality of layers; wherein the plurality of layers comprises at least one charge trapping memory layer, for trapping charge carriers. According to the invention, the charge trapping memory layer itself is formed as a plurality of layers and comprises at least one layer sequence of adjacent layers, wherein the layer sequence comprises an amorphous silicon carbide layer and an amorphous silicon nitride layer.

In this context, it is important that, in the layer sequence comprising an amorphous silicon carbide layer and an amorphous silicon nitride layer, the layers are adjacent to one another, thus forming a layer junction. It is in this way possible to greatly increase the density of deep impurities beyond the deep impurities which are already present in the bulk of the two layers, due to the network mismatch of the amorphous silicon carbide layer and the amorphous silicon nitride layer, and the additional deep impurities which are introduced as a result in the boundary region between the two layers. More specifically, what are known as dangling bonds, i.e., open, unsaturated silicon bonding sites or torn-off silicon bonds, which occur on account of the inadequate network matching, are produced at the interface between the two amorphous networks of the amorphous silicon carbide layer and the amorphous silicon nitride layer. On account of the thermal stability of silicon carbide, these deep impurities cannot be annealed in the mobility gap, which corresponds to the term "band gap" for amorphous materials. The stability of the amorphous silicon carbide network also has a positive influence on the stability of the charge storage in the deep impurities.

According to the invention, therefore, the density of deep impurities in the mobility gap between the valence band and conduction band of the charge trapping memory layer can be increased in an extremely advantageous way. With the sequence comprising a silicon carbide layer and a silicon nitride layer, producing the increased density of the deep impurities, which are additionally present in the bulk, it is possible to produce densities of deep impurities in the range of $3 \times 10^{19}$ cm$^{-3}$ in the charge trapping memory layer. It is in this way possible to considerably increase the data retention and efficiency of charge trapping as compared to conventional charge trapping memory elements. In this context, amorphous silicon carbide layers, on account of their electrical properties such as: leakage currents in the region of $10^{-13}$ A, electrical resistivity of up to $10^{15}$ ohmcm and dielectric strength in the region of $5 \times 10^6$ V/cm, are suitable for use as charge trapping memory layers, especially in combination with a silicon nitride layers. The thermal stability of the amorphous silicon carbide layer, which only begins to recrystallize into beta-silicon carbide at relatively high thermal stresses, e.g., 900° C. for a period of 3 hours, has proven particularly advantageous in this context. On account of the stability of the amorphous silicon carbide network, it is to be expected that the data retention in the deep impurities will also be improved, since relatively high thermal energies are required to reorganize the network and/or saturate the deep impurities generated at the interface.

In a preferred embodiment of the memory element, the charge trapping memory layer comprises an amorphous silicon carbide layer and an amorphous silicon nitride wherein the layers are adjacent. It is advantageous if within the layer sequence, comprising an amorphous silicon carbide layer and an amorphous silicon nitride layer, the layers have about equal volumes. It is also advantageous if the amorphous silicon carbide layer and the amorphous silicon nitride layer have about the same thickness.

The multilayer gate dielectric of the memory element according to the invention advantageously also has boundary layers of silicon dioxide, between which the charge trapping memory layer is embedded. The substrate-side boundary layer is in this case formed as a tunneling layer with a corresponding layer thickness.

According to the invention, it is advantageous if the layer sequence, comprising an amorphous silicon carbide layer and an amorphous silicon nitride layer, has a total layer thickness in the range from approx. 6-7 nm. Despite the relatively low total layer thickness, the high process engineering demands imposed, on account of the relatively low deposition rates for the charge trapping memory layer, can be managed using a process sequence as described below in accordance with the invention.

In a further preferred embodiment of the memory element, the amorphous silicon carbide layer within the layer sequence is arranged on the substrate side. The mobility gap, i.e., band gap, of the amorphous silicon carbide, in the case of virtually stoichiometric silicon carbide, is approx. 3.2 to 3.5 eV, and is therefore lower than the mobility gap, i.e., band gap, of the amorphous silicon nitride ($Si_3N_4$ or SiN), which is approx. 4.5 eV. Therefore, since the amorphous silicon carbide layer is arranged on the substrate side, it is possible to advantageously increase the trapping probability for the charge carrier injection into the charge carrier memory layer.

In a further preferred embodiment of the memory element, the memory layer is deposited by a plasma enhanced chemical vapor deposition (PECVD) deposition process, in particular using $SiH_4$ and $NH_3$ as reactive gases. The formation of deep bulk impurities in the charge trapping memory is promoted in particular if a plasma enhanced chemical vapor deposition (PECVD) process, especially with $SiH_4$ and $NH_3$ as reactive gases, is used instead of a high temperature low pressure chemical vapor deposition (HT-LPCVD) deposition process using an $SiH_2Cl_2$ and an $NH_3$ precursors to deposit the memory layer.

The memory elements according to the invention are advantageously used in a charge trapping semiconductor memory, MOS field-effect transistor using silicon technology, with the memory cells of the memory elements advantageously being arranged in an NAND memory cell array.

The above and still further features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION

Figure 1:
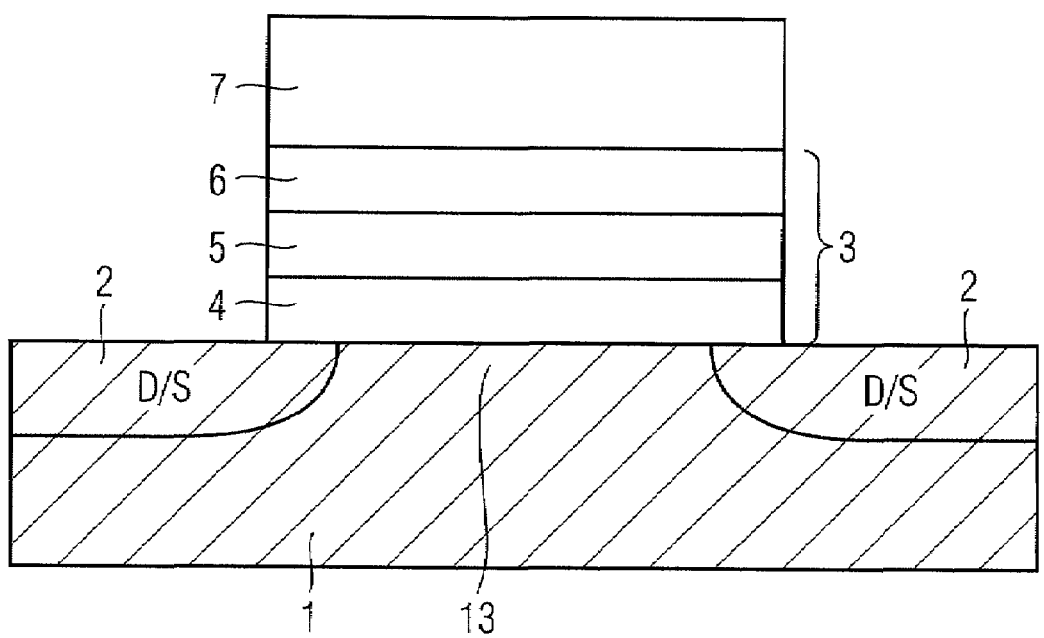
FIG. 1 shows a vertical cross-section through a conventional semiconductor memory element of an SONOS flash memory structure.

FIG. 1, shows a vertical section through a conventional semiconductor memory element of an SONOS flash memory structure in planar geometry. Accordingly, in a p-doped silicon substrate n-doped source/drain regions are formed at a surface of the silicon substrate. Between the n-doped source/drain regions there is a channel region. Above the channel region is a multilayer gate dielectric in the form of a layer stack. The gate dielectric consists of a first oxide layer, which is a tunneling layer, a nitride memory layer for trapping charge carriers from the substrate and a second oxide layer. Above the second oxide layer there is a gate terminal, which comprises a polysilicon gate. The polysilicon gate is generally connected to a gate supply voltage, while at the same time the substrate is grounded.

Figure 2:
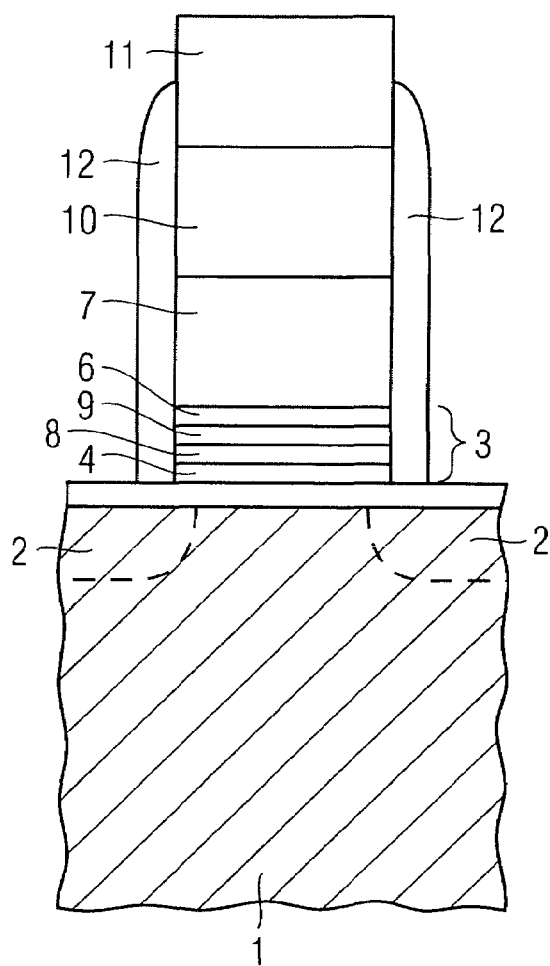
FIG. 2 shows a vertical cross-section through a semiconductor memory element according to the invention, in which the gate dielectric has a quadruple layer structure.

FIG. 2, shows a vertical section through a semiconductor memory element according to the invention, wherein the gate dielectric has a quadruple layer structure. To avoid unnecessary repetition, only the differences with respect to the semiconductor memory element from FIG. 1 will be described.

In the semiconductor memory element according to the invention shown in FIG. 2, unlike in the conventional semiconductor memory element from FIG. 1, the memory layer in the multilayer gate dielectric comprises four layers in the form of a layer stack. Accordingly, the memory layer comprises: a first silicon oxide layer, which is a tunneling oxide layer arranged adjacent to a substrate, a silicon carbide layer arranged adjacent to the first oxide layer, a silicon nitride layer adjacent to the silicon carbide layer and a second silicon oxide layer, arranged adjacent to the silicon nitride layer. Adjacent to the second oxide layer there is a gate electrode material, e.g., polysilicon, arranged adjacent to the gate electrode is a metal layer, and arranged adjacent to the metal layer is a hard mask. Along opposing sides of the layer stack, side wall spacers are deposited. In the example shown, the thickness of the first oxide tunneling layer is about 3 nm, the thickness of the silicon carbide layer is about 2.5 nm, the thickness of the silicon nitride layer is about 4 nm and the thickness of the second oxide layer is about 6 nm.

Figure 3:
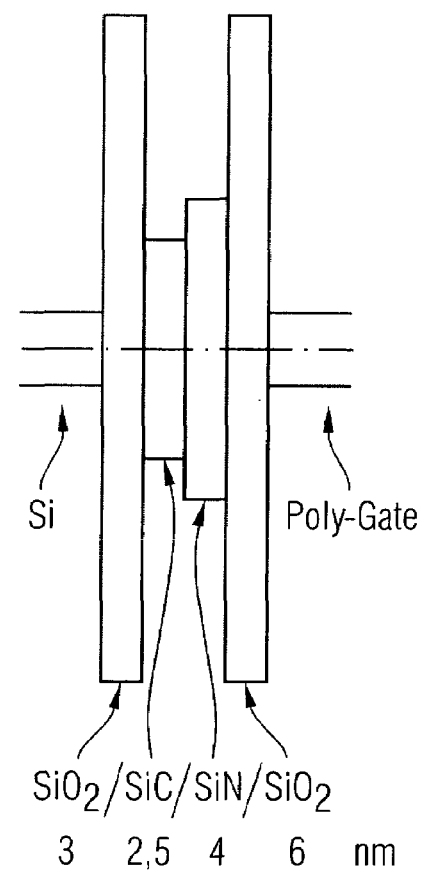
FIG. 3 presents an energy band diagram (band theory) for the quadruple layer structure of the gate dielectric of the semiconductor memory element according to the invention shown in FIG. 2.

FIG. 3 shows an energy band diagram, i.e., band theory, for the field-free quadruple layer structure of the gate dielectric of the semiconductor memory element according to the invention from FIG. 2, with the mobility gap, i.e., band gap, between valence band and conduction band in each case being shown in the drawing. Respective arrows and labels indicate the association with the respective layers of the layer structure. As can be seen from FIG. 3, the conduction band is higher in the silicon carbide than in the silicon substrate, whereas the valence band is deeper than in the silicon substrate. The same is true of the silicon nitride. Moreover, the conduction band of the silicon nitride is higher than the conduction band of the silicon carbide, while the valence band of the silicon nitride is lower than the valence band of the silicon carbide. This is reflected in the mobility gaps: as has already been stated above, the smaller mobility gap of the silicon carbide amounts to about 3.2-3.5 eV, while that of silicon nitride is about 4.5 eV. On account of the smaller band gap of the silicon carbide, which is arranged adjacent to the first oxide layer on the substrate side, it is possible to increase the trapping probability for charge carriers.

Figure 4A:
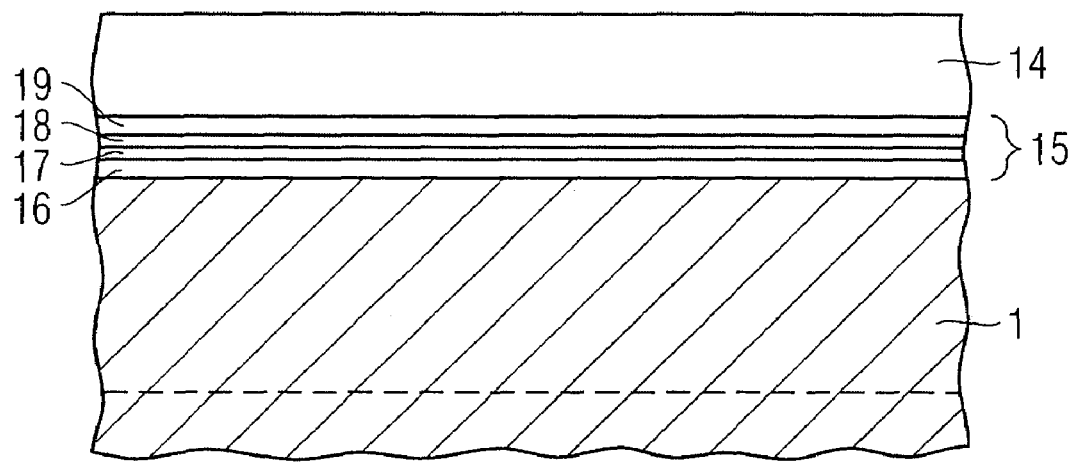
FIGS. 4A-4D illustrates intermediate products formed during the fabrication of the semiconductor memory elements according to the invention.
Figure 4B:
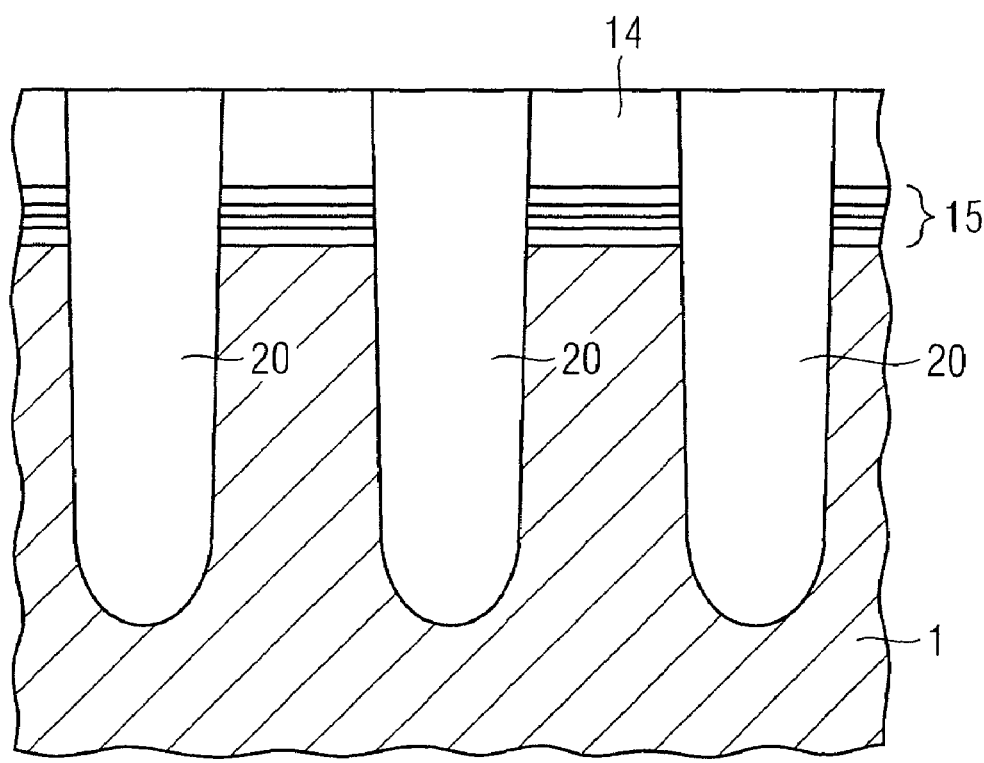
Figure 4C:
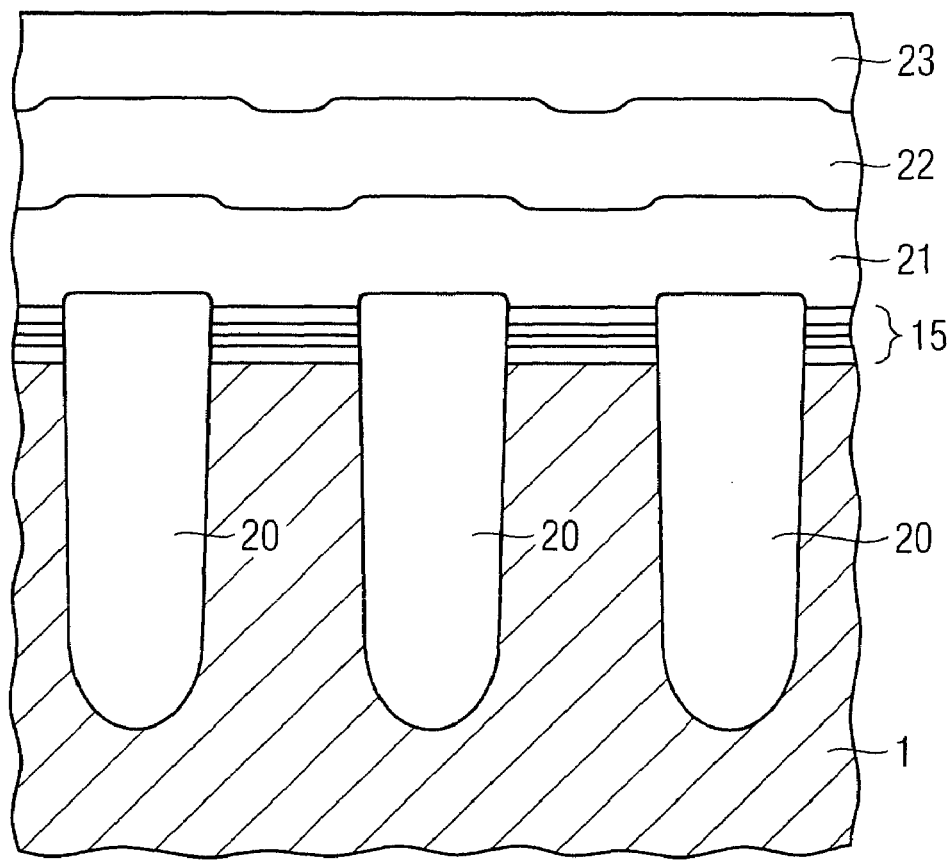
Figure 4D:
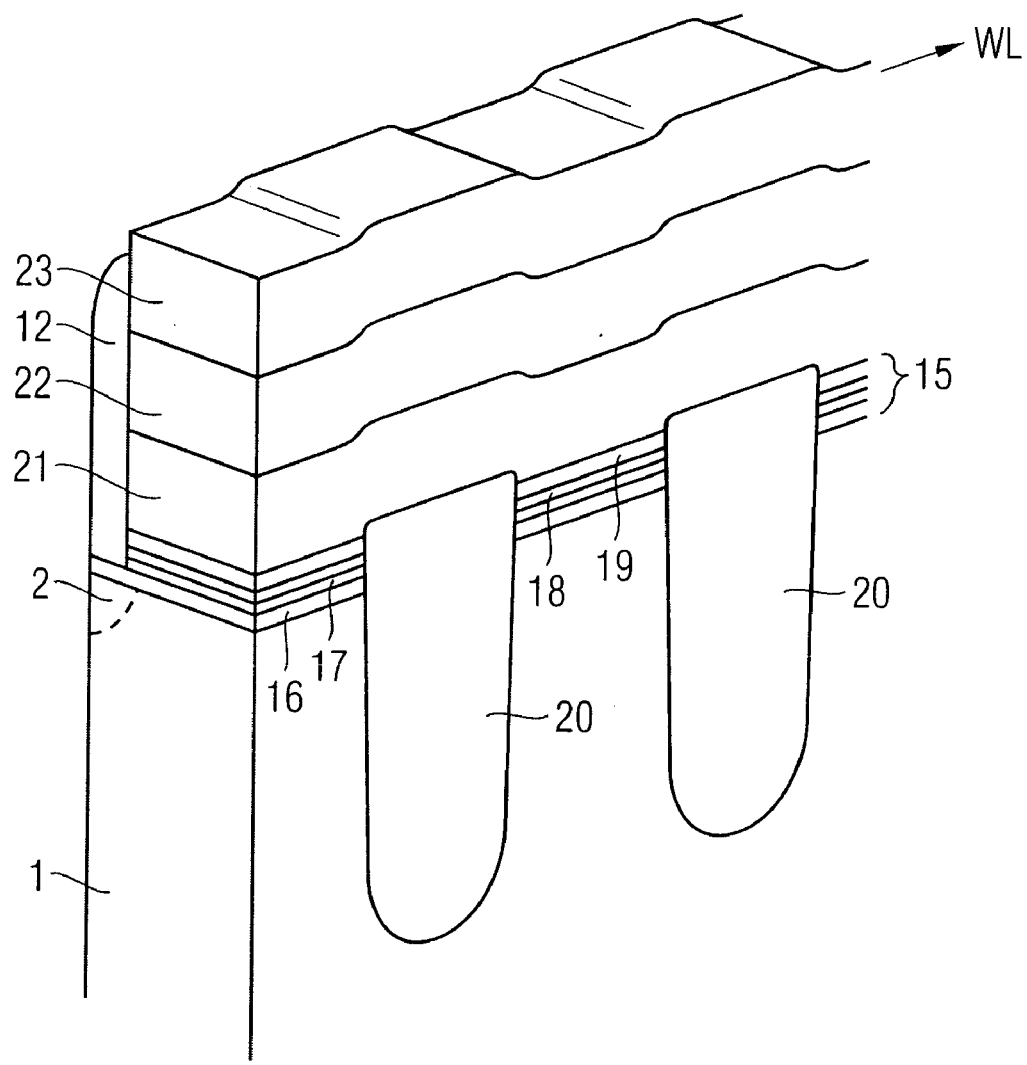

FIGS. 4A-4D, illustrate intermediate products involved in the fabrication of semiconductor memory elements according to the invention in order to illustrate a preferred fabrication method, which is based on the NOR and NAND flash memory technology. FIGS. 4A-4C show vertical sections through intermediate products, while FIG. 4D illustrates a perspective view of an intermediate product, along a word line WL.

Accordingly, in the process, for fabrication of semiconductor memory elements according to the invention, a silicon substrate is provided, wherein the substrate is p-doped at least toward the surface. The provision of a substrate having active structures is well known to one of ordinary skill in the art and therefore requires no further explanation at this point.

Then, a quadruple layer sequence, in the following order, comprising: a silicon oxide tunneling layer, a silicon carbide layer, a silicon nitride layer and a silicon oxide layer, wherein the quadruple layer is deposited on the surface of the substrate. The silicon oxide tunneling layer is produced via thermal oxidation, in a layer thickness of about 2.5-3 nm. Alternatively, it is also possible to employ a standard high-temperature LPCVD process, based on thermal decomposition of tetraethylorthosilicate, TEOS at about. 700° C. In principle, the LPCVD process and the PECVD process can be employed for the deposition of the SiC/SiN layer sequence. Although the LPCVD process is generally employed for the deposition of the trapping memory layer, employing the PECVD technique, by contrast, has proven advantageous for the deposition of the SiC/SiN layer sequence with regard to the density of deep impurities which can be achieved. For this purpose, a substrate temperature of 350° is selected and the reactive gases used are $SiH_4$, $CH_4$, $H_2$, $NO_2$ and $NH_3$, with the total gas mixture reaching a pressure of about 0.05 Torr. The RF power and the gas concentration are selected in such a way as to achieve a deposition rate for the layers of about 0.75 A/sec. In general, PECVD achieves deposition rates for dense, amorphous SiC or SiN layers with good dielectric properties of up to 1.5 A/sec, so that at the favored rate about 80 to 90 seconds are available for the deposition of the layer sequence with a layer thickness of about 6 to 7 nm.

First, a PECVD process is carried out at 350° C. using the reactive gases $CH_4/SiH_4/H_2$ to produce a silicon carbide layer with a layer thickness of about 2.5 nm, followed by a PECVD process at 350° C. using the reactive gases $CH_4/NH_3$ to produce a silicon nitride layer with a layer thickness of about 3.5 nm.

Furthermore, the deposition of the amorphous alternating layer system, i.e., the layer sequence comprising an amorphous silicon carbide layer and an amorphous silicon nitride layer, begins with a thin SiC:N layer, not shown in more detail, in order to minimize the density of states at the interface with the silicon dioxide tunneling layer. This interfacial coverage is produced by a PECVD process carried out for 15 seconds at 350° C. using the reactive gases $CH_4/SiH_4/H_2$.

The silicon dioxide second oxide layer is then deposited on the charge trapping memory layer, for example, using a high-temperature LPCVD process via thermal decomposition of TEOS at 700° C. Alternatively, this layer can also be formed employing an HTO, high temperature oxide.

In subsequent procedures, further silicon dioxide gate oxides with a different layer thickness are deposited via thermal oxidation in wet or dry oxygen at a temperature between 800° C. and 1050° C., in the usual way, at locations where the multilayer gate dielectric, comprising a charge trapping memory layer and adjoining boundary layers, has been at least partially removed via an etching process. These process conditions ensure that the second oxide layer of the ONO structure is qualitatively improved or densified. If these further gate oxides are to be omitted following the deposition of the ONO structure, a process of densifying the second oxide is consequently required. It is in this context particularly important that the charge trapping alternating layer, comprising an amorphous SiC/SiN, should not be damaged by these process conditions. This condition is also satisfied by the high thermal stability of the amorphous silicon carbide.

Furthermore, a hard mask layer is deposited adjacent to the second oxide layer, or the plurality of second oxide layers. After patterning of the hard mask layer, STI trenches, STI=shallow trench isolation, are etched into the substrate in a parallel orientation and spaced apart from one another. These procedures employed to form the STI trenches are well known to one of ordinary skill in the art and consequently require no further detailed description.

Then, the hard mask layer is removed following a planarization process. An electrode material layer, comprising, for example, polysilicon, tantalum nitride or nickel silicide, is deposited, followed by deposition of a further metallization and of a hard mask layer. This word line layer stack is patterned with the aid of a resist mask and suitable dry etching steps to form gate electrodes of the memory cells. Then, self-aligned source/drain regions are formed in the usual way by ion implantation; spacer layers can also be employed to define the spacing. Source/drain implantations, which are self-aligned with respect to the word line, produce memory cells with channel regions that are delimited by STI isolation. These standard procedures are well known to one of ordinary skill in the art and therefore require no further explanation at this point.

While the invention has been described in detail and with reference to specific embodiments thereof, it will be apparent to one of ordinary skill in the art that various changes and modifications can be made therein without departing from the spirit and scope thereof. Accordingly, it is intended that the present invention covers the modifications and variations of this invention provided they come within the scope of the appended claims and their equivalents.

LIST OF DESIGNATIONS

1 Substrate
2 Source/drain region
3 Gate dielectric
4 First oxide layer
5 Memory layer
6 Second oxide layer
7 Gate electrode
8 Silicon carbide layer
9 Silicon nitride layer
10 Metal layer
11 Hard mask
12 Side wall spacer
13 Channel region
14 Hard mask layer
15 Quadruple gate dielectric
16 Silicon dioxide tunneling layer
17 Silicon carbide layer
18 Silicon nitride layer
19 Silicon dioxide second oxide layer
20 STI trench isolation
21 Gate electrode
22 Metallization
23 Hard mask layer

What is claimed is:

1. A semiconductor memory element that is controllable via field effect, the semiconductor memory element comprising:
   a semiconductor substrate of a first conduction type;
   a first doping region of a second conduction type provided in the semiconductor substrate;
   a second doping region of the second conduction type provided in the semiconductor substrate;
   a channel region located between the first and second doping regions;
   a multilayer gate dielectric that is arranged adjacent to the channel region and includes a charge trapping memory layer; and
   a gate terminal provided above the gate dielectric;
   wherein the charge trapping memory layer comprises at least one sequence of adjacent layers, the sequence of adjacent layers comprising an amorphous silicon carbide layer and an amorphous silicon nitride layer.

2. The memory element according to claim 1, wherein the charge trapping memory layer comprises adjacent amorphous silicon carbide and amorphous silicon nitride layers.

3. The memory element according to claim 1, wherein the amorphous silicon carbide layer is arranged closer to a surface of the substrate than the amorphous silicon nitride layer.

4. The memory element according to claim 1, wherein the layers of the layer sequence comprising an amorphous silicon carbide layer and an amorphous silicon nitride layer have about equal volumes.

5. The memory element according to claim 1, wherein the layer sequence comprising an amorphous silicon carbide layer and an amorphous silicon nitride layer has a total layer thickness in the range of about 6-7 nm.

6. The memory element according to claim 1, wherein the multilayer gate dielectric comprises first and second silicon dioxide boundary layers and a charge trapping memory layer that is arranged between the two boundary layers.

7. The memory element according to claim 1, wherein the charge trapping memory layer has a deep impurity density in the range of $3 \times 10^{19}$ cm$^{-3}$.

8. The memory element according to claim 1, wherein the charge trapping memory layer has been deposited by a PECVD process using $SiH_4$ and $NH_3$ as reactive gases.

9. A memory cell array having a NAND architecture and comprising a plurality of memory cells including memory elements according to claim 1.

10. A charge trapping semiconductor memory comprising a plurality of memory cells including memory elements according to claim 1.

11. A method for fabricating the memory element according to claim 1, wherein the charge trapping memory layer is produced via a PECVD process.

12. The method according to claim 11, wherein reactive gases $CH_4/SiH_4/H_2$ are utilized to produce a silicon carbide layer, and reactive gases $CH_4/NH_3$ are utilized to produce a silicon nitride layer.

* * * * *